(12) United States Patent
Takamine

(10) Patent No.: US 9,197,193 B2
(45) Date of Patent: Nov. 24, 2015

(54) SIGNAL SEPARATION APPARATUS

(71) Applicant: Murata Manufacturing Co., Ltd., Nagaokakyo-shi, Kyoto-fu (JP)

(72) Inventor: Yuichi Takamine, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 54 days.

(21) Appl. No.: 14/299,096

(22) Filed: Jun. 9, 2014

(65) Prior Publication Data

US 2014/0368295 A1    Dec. 18, 2014

(30) Foreign Application Priority Data

Jun. 13, 2013  (JP) ................. 2013-124725

(51) Int. Cl.
*H03H 9/60* (2006.01)
*H03H 9/72* (2006.01)
*H03H 9/64* (2006.01)
*H03H 9/00* (2006.01)

(52) U.S. Cl.
CPC ............. *H03H 9/725* (2013.01); *H03H 9/0057* (2013.01); *H03H 9/6456* (2013.01)

(58) Field of Classification Search
CPC ............................ H03H 9/0057; H03H 9/205
USPC ........................................ 333/133, 193–196
See application file for complete search history.

(56) References Cited

U.S. PATENT DOCUMENTS

| | | | | |
|---|---|---|---|---|
| 7,135,944 B2* | 11/2006 | Iwamoto | ............... | H03H 9/0028 333/133 |
| 7,459,997 B2* | 12/2008 | Takamine | ............ | H03H 9/0028 333/193 |
| 7,872,548 B2* | 1/2011 | Nishihara | ............ | H03H 9/0576 333/193 |
| 8,305,160 B2* | 11/2012 | Yamamoto | ........... | H03H 9/0057 333/133 |
| 2004/0201435 A1 | 10/2004 | Ouchi et al. | | |
| 2007/0296522 A1 | 12/2007 | Takamine | | |
| 2010/0045399 A1* | 2/2010 | Yasuda | ................ | H03H 9/0038 333/25 |
| 2012/0086521 A1* | 4/2012 | Tsurunari | .......... | H03H 9/02834 333/133 |
| 2012/0274418 A1 | 11/2012 | Takata et al. | | |
| 2013/0120084 A1* | 5/2013 | Bauer | ................. | H03H 9/0057 333/193 |
| 2014/0009247 A1* | 1/2014 | Moriya | ................. | H03H 9/725 333/133 |

FOREIGN PATENT DOCUMENTS

| | | |
|---|---|---|
| JP | 2004-312576 A | 11/2004 |
| JP | 2008-5151 A | 1/2008 |
| JP | 2008-118277 A | 5/2008 |
| JP | 2012-205215 A | 10/2012 |
| WO | 2011/092876 A1 | 8/2011 |

OTHER PUBLICATIONS

Official Communication issued in corresponding Japanese Patent Application No. 2013-124725, mailed on May 19, 2015.

* cited by examiner

*Primary Examiner* — Dean Takaoka
(74) *Attorney, Agent, or Firm* — Keating & Bennett, LLP

(57) ABSTRACT

A signal separation apparatus includes a piezoelectric substrate on which a transmission filter and a reception filter are provided. The reception filter includes first, second and third longitudinally coupled resonator-type elastic wave filter devices and the first, second and third longitudinally coupled resonator-type elastic wave filter devices each including a two-stage cascade connection structure. The signal separation apparatus further includes virtual ground wiring lines that are not connected to a ground potential and that connect ground terminals of adjacent longitudinally coupled resonator-type elastic wave filter units to each other on at least one of a first, second, and third group-A longitudinally coupled resonator-type elastic wave filter units side and a first, second, and third group-B longitudinally coupled resonator-type elastic wave filter units side.

14 Claims, 7 Drawing Sheets

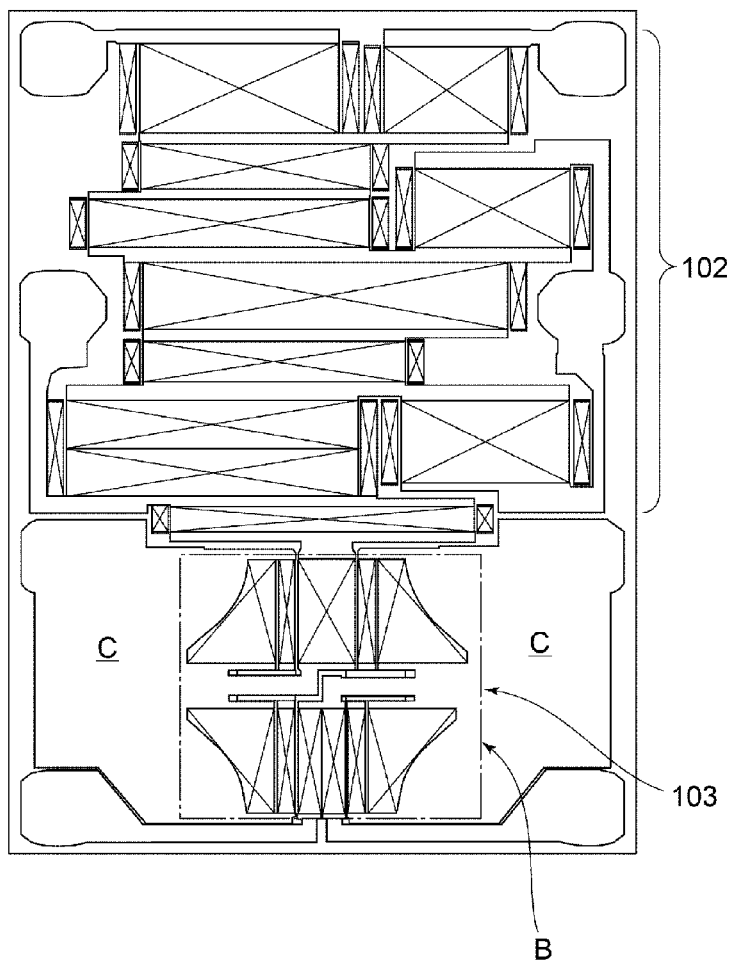

SIGNAL SEPARATION APPARATUS

BACKGROUND OF THE INVENTION

1. Field of the Invention

The present invention relates to a signal separation apparatus including a longitudinally coupled resonator-type elastic wave filter apparatus that includes a plurality of longitudinally coupled resonator-type elastic wave filter devices having a two-stage cascade connection structure.

2. Description of the Related Art

A duplexer, which is a type of signal separation apparatus, used for mobile communication includes a transmission filter and a reception filter. To date, longitudinally coupled resonator-type elastic wave filter apparatuses have been widely used as reception filters. In Japanese Unexamined Patent Application Publication No. 2012-205215, a longitudinally coupled resonator-type elastic wave filter apparatus used as a reception filter includes first and second longitudinally coupled resonator-type elastic wave filter devices. In each of the first and second longitudinally coupled resonator-type elastic wave filter devices, two longitudinally coupled resonator-type elastic wave filter units are cascade-connected in two stages. In other words, the reception filter described above is a two-stage two-element longitudinally coupled resonator-type elastic wave filter apparatus.

In recent years, to realize a reduction in size, a duplexer, a type of signal separation apparatus, having a structure in which a transmission filter and a reception filter are formed on a single piezoelectric substrate has been used. With this structure, when the above-described two-stage two-element longitudinally coupled resonator-type elastic wave filter, which has a large longitudinal dimension, is used as the reception filter, a dead space is generated in the lateral direction. In addition, there has been a problem in that the degree of freedom in designing a transmission filter is decreased.

On the other hand, when a reception filter formed of a longitudinally coupled resonator-type elastic wave filter and a transmission filter are arranged in the lateral direction described above, characteristics are degraded due to mutual influence caused by leakage of signals.

SUMMARY OF THE INVENTION

Accordingly, preferred embodiments of the present invention provide a signal separation apparatus which includes a longitudinally coupled resonator-type elastic wave filter and which allows a longitudinal dimension to be significantly reduced and a degree of freedom in designing a transmission filter to be significantly increased.

According to a preferred embodiment of the present invention, a signal separation apparatus includes a piezoelectric substrate, a reception filter located on the piezoelectric substrate, and a transmission filter located on the piezoelectric substrate.

The reception filter includes an input terminal, an output terminal, and first, second and third longitudinally coupled resonator-type elastic wave filter devices electrically connected in series or in parallel with one another at least on one of an input terminal side and an output terminal side.

The first, second and third longitudinally coupled resonator-type elastic wave filter devices have a configuration in which first, second and third group-A longitudinally coupled resonator-type elastic wave filter units are respectively cascade-connected with first, second and third group-B longitudinally coupled resonator-type elastic wave filter units in two stages, and the longitudinally coupled resonator-type elastic wave filter units each include an IDT electrode.

According to a preferred embodiment of the present invention, a virtual ground wiring line that is not connected to a ground potential and that connects ground terminals of adjacent longitudinally coupled resonator-type elastic wave filter units to each other, on at least one of a first, second, and third group-A longitudinally coupled resonator-type elastic wave filter units side and a first, second, and third group-B longitudinally coupled resonator-type elastic wave filter units side, is further provided. Further, the transmission filter is provided in a region extending from the reception filter in an interstage direction of the two-stage cascade connection in the reception filter.

In the signal separation apparatus according to a preferred embodiment of the present invention, preferably, an output terminal of the reception filter includes a pair of balanced reception terminals and the reception filter is a balanced-type reception filter, and ground terminals of the IDT electrodes connected to the pair of balanced reception terminals are electrically connected to each other by the virtual ground wiring line.

In the signal separation apparatus according to a preferred embodiment of the present invention, preferably, as the virtual ground wiring line, a first virtual ground wiring line that connects ground terminals of at least two of the first, second, and third group A longitudinally coupled resonator-type elastic wave filter units to one another, and a second virtual ground wiring line that connects ground terminals of at least two of the first, second, and third group B longitudinally coupled resonator-type elastic wave filter units to one another are provided.

In the signal separation apparatus according to a preferred embodiment of the present invention, preferably, the first group-A longitudinally coupled resonator-type elastic wave filter unit and the first group-B longitudinally coupled resonator-type elastic wave filter unit are cascade-connected with each other in two stages through a first interstage connection wiring line and a second interstage connection wiring line, and a signal flowing through the first interstage connection wiring line and a signal flowing through the second interstage connection wiring line have opposite phases.

Since the signal separation apparatus according to a preferred embodiment of the present invention includes the first, second and third longitudinally coupled resonator-type elastic wave filter devices in which the longitudinally coupled resonator-type elastic wave filter units are cascade-connected in two stages, that is, the reception filter having a two-stage six-element configuration is preferably used, the dimension of the reception filter in the longitudinal direction is significantly decreased. Further, since the transmission filter is arranged in a region extending from the reception filter in an interstage direction of the two-stage serial connection in the reception filter, the size of the signal separation apparatus is significantly reduced. Further, the degree of freedom in designing the transmission filter is significantly increased.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 7 is a plan view of the signal separation apparatus of the comparative example.

DETAILED DESCRIPTION OF THE PREFERRED EMBODIMENTS

Hereinafter, specific preferred embodiments of the present invention will be described with reference to the drawings.

Figure 1:
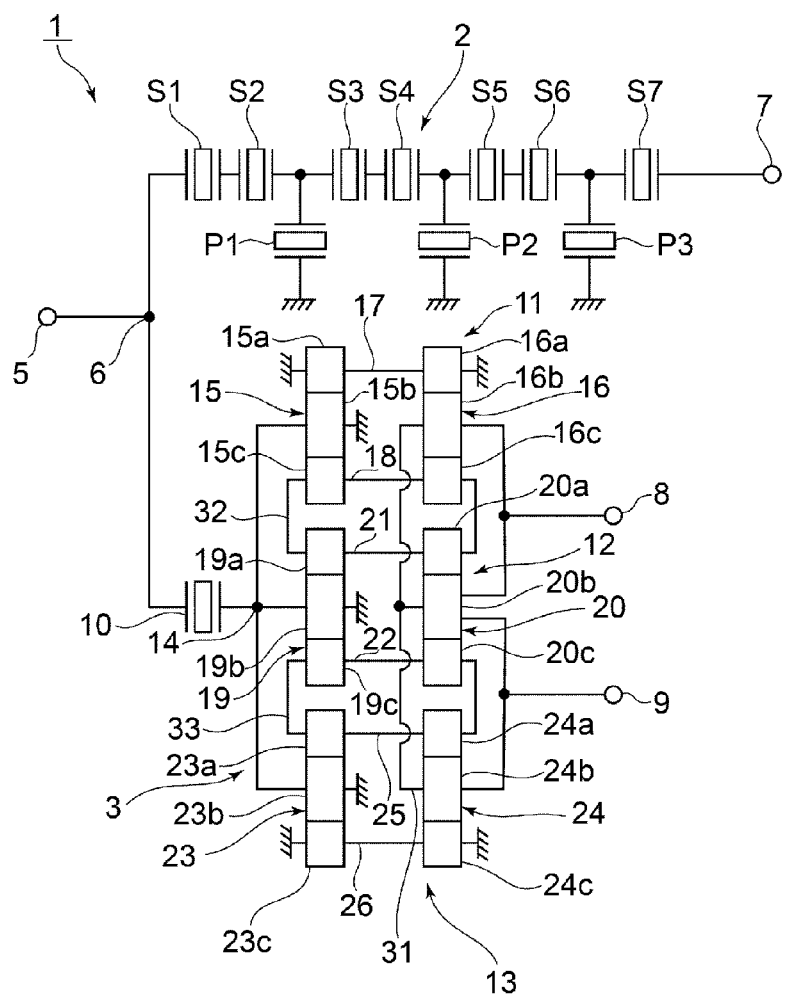
FIG. 1 is a circuit diagram of a signal separation apparatus according to a first preferred embodiment of the present invention.
Figure 2:
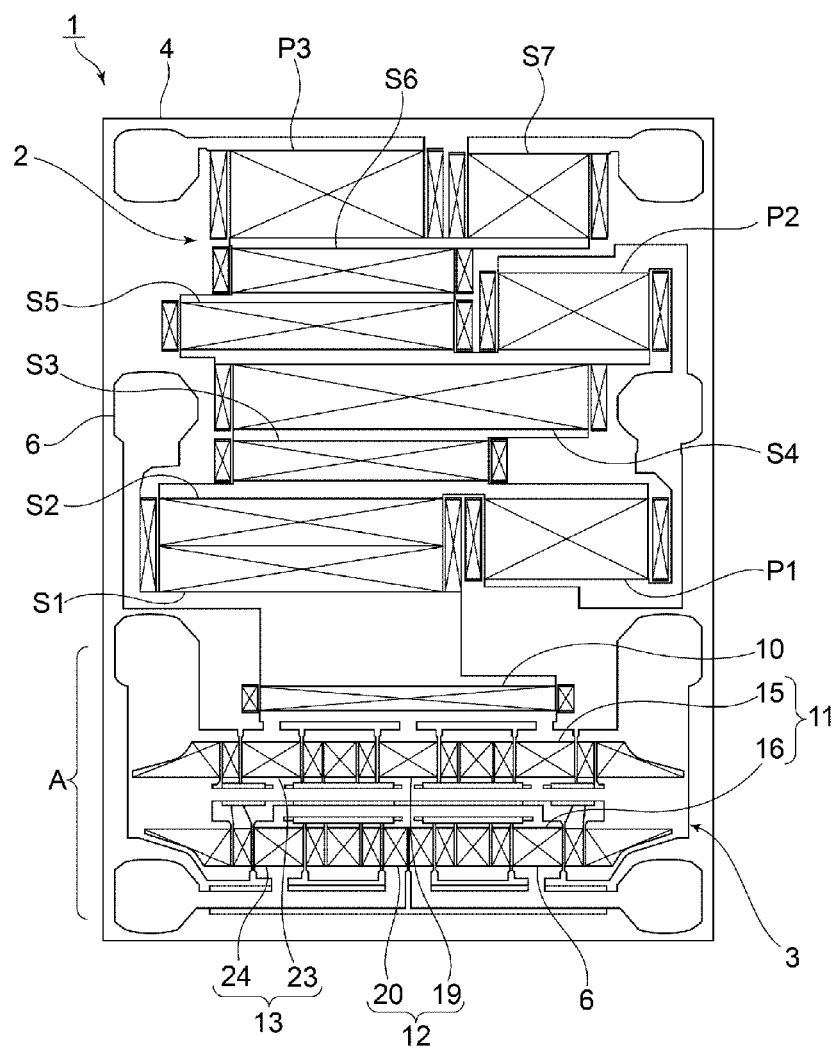
FIG. 2 is a plan view of the signal separation apparatus according to the first preferred embodiment of the present invention.

FIG. 1 is a circuit diagram of a duplexer according to a first preferred embodiment of the present invention, and FIG. 2 is a schematic plan view thereof.

Referring to FIG. 1, a signal separation apparatus 1 includes a transmission filter 2 and a reception filter 3. Referring to FIG. 2, in the signal separation apparatus 1, the transmission filter 2 and the reception filter 3 described above are provided on a piezoelectric substrate 4.

Referring back to FIG. 1, the signal separation apparatus 1 includes an antenna terminal 5 and a common connection point 6 connected to the antenna terminal 5. The transmission filter 2 is connected between the common connection point 6 and a transmission terminal 7. The reception filter 3 is connected between the common connection point 6 and first and second balanced terminals 8 and 9. In the present preferred embodiment, the transmission filter 2 is a ladder filter including a plurality of elastic wave resonators, although not limited thereto. More specifically, the transmission filter 2 includes series arm resonators S1 to S7 and parallel arm resonators P1 to P3.

The series arm resonators S1 to S7 and the parallel arm resonators P1 to P3 preferably include one-port elastic wave resonators. Each one-port elastic wave resonator, as is well known, includes an IDT electrode and a pair of reflectors arranged on both sides of the IDT electrode in the propagation direction of an elastic wave. In FIG. 2, portions where the IDT electrodes or the reflectors are provided are schematically represented by rectangular or substantially rectangular shapes each with a cross mark therein.

The reception filter 3 includes a one-port elastic wave resonator 10 one end of which is connected to the common connection point 6. The elastic wave resonator 10 need not necessarily be provided.

The other end of the elastic wave resonator 10 is connected to a common connection point 14. The input ends of first, second and third longitudinally coupled resonator-type elastic wave filter devices 11 to 13 are connected to the common connection point 14.

In the present preferred embodiment, the reception filter 3 includes the common connection point 6 as an input terminal and the first and second balanced terminals 8 and 9 as output terminals. The first, second and third longitudinally coupled resonator-type elastic wave filter devices 11 to 13 are electrically connected in series between the first and second balanced terminals 8 and 9 via a ground potential. In this case, on the common connection point 6 side as the input terminal side, the first, second and third longitudinally coupled resonator-type elastic wave filter devices 11 to 13 are electrically connected in parallel to the common connection point 6.

In various preferred embodiments of the present invention, the first, second and third longitudinally coupled resonator-type elastic wave filter devices 11 to 13 need only be electrically connected in series or in parallel on at least one of the input terminal side and the output terminal side.

The first, second and third longitudinally coupled resonator-type elastic wave filter devices 11 to 13 each preferably have a configuration in which two longitudinally coupled resonator-type elastic wave filter units are cascade-connected in two stages. More specifically, the first longitudinally coupled resonator-type elastic wave filter device preferably has a configuration in which a first group-A longitudinally coupled resonator-type elastic wave filter unit 15 and a first group-B longitudinally coupled resonator-type elastic wave filter unit 16 are cascade-connected in two stages. The first group-A and group-B longitudinally coupled resonator-type elastic wave filter units 15 and 16 each include three IDTs arranged in an elastic wave propagation direction.

In FIG. 1, these IDTs are schematically represented by rectangular or substantially rectangular shapes. When taking the first group-A longitudinally coupled resonator-type elastic wave filter unit 15 as an example, IDT electrodes 15a to 15c are arranged in an elastic wave propagation direction. Although omitted in FIG. 1, reflectors are arranged on both sides of the IDT electrodes 15a to 15c in the elastic wave propagation direction. Thus, a three-IDT longitudinally coupled resonator-type elastic wave filter unit is provided.

In the first longitudinally coupled resonator-type elastic wave filter device 11, the first group-A longitudinally coupled resonator-type elastic wave filter unit 15 is connected to the first group-B longitudinally coupled resonator-type elastic wave filter unit 16 through first and second interstage connection wiring lines 17 and 18. A signal flowing through the first interstage connection wiring line 17 and a signal flowing through the second interstage connection wiring line 18 are made to have opposite phases.

The common connection point 14 is connected to one end of the IDT electrode 15b, and the other end of the IDT electrode 15b is connected to the ground potential. One end of the IDT electrode 15a and one end of the IDT electrode 15c are respectively electrically connected to the first and second interstage connection wiring lines 17 and 18 described above.

The other end of the IDT electrode 15a is connected to the ground potential. The other end of the IDT electrode 15c is connected to an IDT electrode 19a of a second group-A longitudinally coupled resonator-type elastic wave filter unit 19 of the second longitudinally coupled resonator-type elastic wave filter device 12 described later. The first group-B longitudinally coupled resonator-type elastic wave filter unit 16 also includes IDT electrodes 16a to 16c arranged in an elastic wave propagation direction. One end of the IDT electrode 16a and one end of the IDT electrode 16c are connected to the first and second interstage connection wiring lines 17 and 18 described above. The other end of the IDT electrode 16a is connected to the ground potential. One end of the IDT electrode 16b is connected to the first balanced terminal 8. A ground terminal as the other end of the IDT electrode 16b is connected to a virtual ground wiring line 31, which is a characteristic of the present invention. The other end of the IDT electrode 16c is connected to an IDT electrode 20a described later.

The second longitudinally coupled resonator-type elastic wave filter device 12 and the third longitudinally coupled resonator-type elastic wave filter device 13 also have similar configurations as the first longitudinally coupled resonator-type elastic wave filter device 11. In other words, in the second longitudinally coupled resonator-type elastic wave filter device 12, the second group-A longitudinally coupled resonator-type elastic wave filter unit 19 includes the IDT electrodes 19a described above and IDT electrodes 19b and 19c. A second group-B longitudinally coupled resonator-type elastic wave filter unit 20 includes the IDT electrode 20a described above and IDT electrodes 20b and 20c. The second group-A longitudinally coupled resonator-type elastic wave filter unit 19 is electrically connected to the second group-B longitudinally coupled resonator-type elastic wave filter unit 20 through first and second interstage connection wiring lines 21 and 22.

Also in the third longitudinally coupled resonator-type elastic wave filter device 13, a third group-A longitudinally coupled resonator-type elastic wave filter unit 23 includes three IDT electrodes 23a to 23c. A third group-B longitudinally coupled resonator-type elastic wave filter unit 24 includes three IDT electrodes 24a to 24c. The third group-A longitudinally coupled resonator-type elastic wave filter unit 23 is electrically connected to the third group-B longitudinally coupled resonator-type elastic wave filter unit 24 through first and second interstage wiring lines 25 and 26.

The IDT electrode 20b of the second group-B longitudinally coupled resonator-type elastic wave filter unit 20 includes first and second divided IDT portions (not illustrated) formed by division of the IDT in the elastic wave propagation direction. The first divided IDT portion is connected to the first balanced terminal 8 and the second divided IDT portion is connected to the second balanced terminal 9.

One end of the IDT electrode 24b of the third group-B longitudinally coupled resonator-type elastic wave filter unit 24 is connected to the second balanced terminal 9.

In the reception filter 3 of the signal separation apparatus 1 described above, the IDT electrodes 16b, 20b, and 24b are connected to one another through the virtual ground wiring line 31. In other words, between the longitudinally coupled resonator-type elastic wave filter units 16 and 20 that neighbor each other, an end portion of the IDT electrode 16b and an end portion of the IDT electrode 20b are connected to each other through the virtual ground wiring line 31. Similarly, between the longitudinally coupled resonator-type elastic wave filter units 20 and 24 that neighbor each other, the one end of the IDT electrode 20b and the other end of the IDT electrode 24b, which are end portions to be connected to the ground potential, are connected to each other through the virtual ground wiring line 31.

The end portions, connected to the ground potential, of the IDT electrodes 16b, 20b, and 24b are the ground terminals of the IDT electrodes 16b, 20b, and 24b. Hence, in other words, the ground terminals of the IDT electrodes 16b, 20b, and 24b are commonly connected to the virtual ground wiring line 31, and are not connected to the ground potential.

End portions of the IDT electrodes 15c and 19a opposite the end portions connected to the interstage connection wiring lines 18 and 21 are connected to each other through a virtual ground wiring line 32, and end portions of the IDT electrodes 19c and 23a opposite the end portions connected to the interstage connection wiring lines 22 and 25 are also connected to each other through virtual ground wiring line 33.

Similarly, end portions of the IDT electrodes 16c and 20a opposite the end portions connected to the interstage connection wiring lines 18 and 21 are also connected to each other through a virtual ground wiring line 34, and end portions of the IDT electrodes 20c and 24a opposite the end portions connected to the interstage connection wiring lines 22 and 25 are also connected to each other through a virtual ground wiring line 35.

As a result, since a configuration without connection to the ground potential is preferably used, that is, since the virtual ground wiring lines 31, 32, 33, 34 and 35 need only be provided, the dimension of the reception filter 3 in the interstage direction is decreased.

As described above, in the first, second and third longitudinally coupled resonator-type elastic wave filter devices 11 to 13 each having a two-stage cascade connection structure, the dimension, in the interstage direction, of the reception filter 3 is significantly decreased. Referring to FIG. 2, it can be seen that the dimension, in the interstage connection direction, of a region A where the reception filter 3 is provided on the piezoelectric substrate 4 is small. As a result, a region where the transmission filter 2 is provided is sufficiently enlarged.

As described above, in the present preferred embodiment, since the region A where the reception filter 3 is provided is significantly reduced, the transmission filter 2 can be designed so as to fit into a larger region. As a result, insertion loss in the transmission filter 2 is significantly reduced and the filter characteristics are greatly enhanced. Further, it also becomes possible to increase the number of stages in the transmission filter 2, such that electric power handling capability is enhanced. In other words, the degree of freedom in designing the transmission filter 2 is significantly increased.

Note that, referring back to FIG. 1, the IDT electrodes 15b, 19b, and 23b are configured in such a manner that the end portions to be connected to the ground potential are connected to the ground potential. However, these end portions may also be connected to one another through at least one virtual ground wiring line. The end portions of the IDT electrodes 15a and 23c, which are similarly connected to the ground potential, may also be connected to a virtual ground wiring line.

Figure 3:
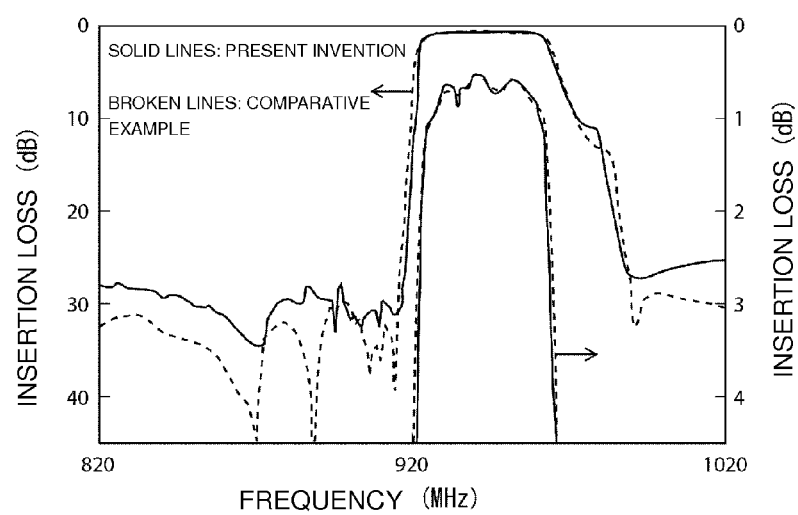
FIG. 3 is a diagram illustrating the frequency characteristics of the attenuation of a reception filter in the signal separation apparatus according to the first preferred embodiment of the present invention and a reception filter in a comparative example.

FIG. 3 is a diagram illustrating the reception characteristics, i.e., the attenuation-frequency characteristics, of the reception filter 3 of the signal separation apparatus of the preferred embodiment described above. The solid lines represent the reception characteristics of the above-described preferred embodiment. The broken lines represent the reception characteristics of a comparative example.

Figure 6:
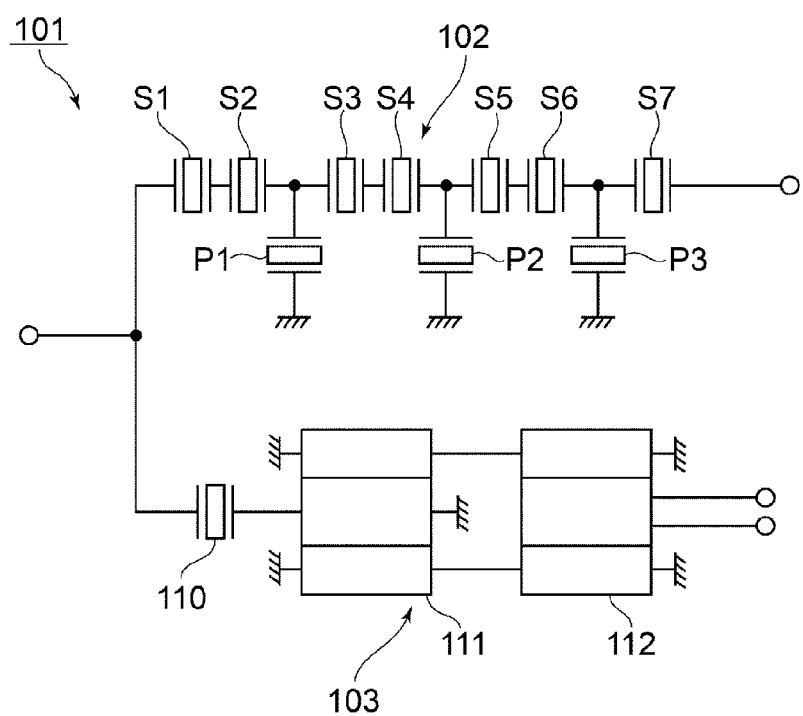
FIG. 6 is a circuit diagram of a signal separation apparatus of the comparative example.

Note that a signal separation apparatus 101 illustrated in FIG. 6 and FIG. 7 was prepared as the comparative example. In other words, the signal separation apparatus 101 illustrated in FIG. 6 includes a transmission filter 102 and a reception filter 103. The transmission filter 102 is configured similarly to the preferred embodiment described above. The reception filter 103 includes a one-port elastic wave resonator 110 and three-IDT longitudinally coupled resonator-type elastic wave filter devices 111 and 112 which are located in subsequent stages and are serially connected to the one-port elastic wave resonator 110. The three-IDT longitudinally coupled resonator-type elastic wave filter devices 111 and 112 are cascade-connected. In other words, here, the reception filter 103 has a configuration which includes a two-stage two-element configuration longitudinally coupled resonator-type elastic wave filter device.

Referring to FIG. 7, the dimension of a region B where the reception filter 103 is provided, in a direction perpendicular to the interstage connection direction, i.e., the lateral dimension of the region B, is small. Hence, large dead spaces C exist and, hence, a reduction in size is not realized. In addition, the longitudinal dimension is not significantly reduced. As a result, the degree of freedom in designing the transmission filter 102 is low.

Note that as illustrated by the solid lines and broken lines in FIG. 3, it can be seen that the respective elastic wave filters in the above-described preferred embodiment and in the comparative example have about the same reception characteristics.

Hence, it can be seen that the signal separation apparatus 1 described above enables a reduction in size and allows the degree of freedom in designing a transmission filter to be increased, while preventing degradation of the reception characteristics.

Figure 4:
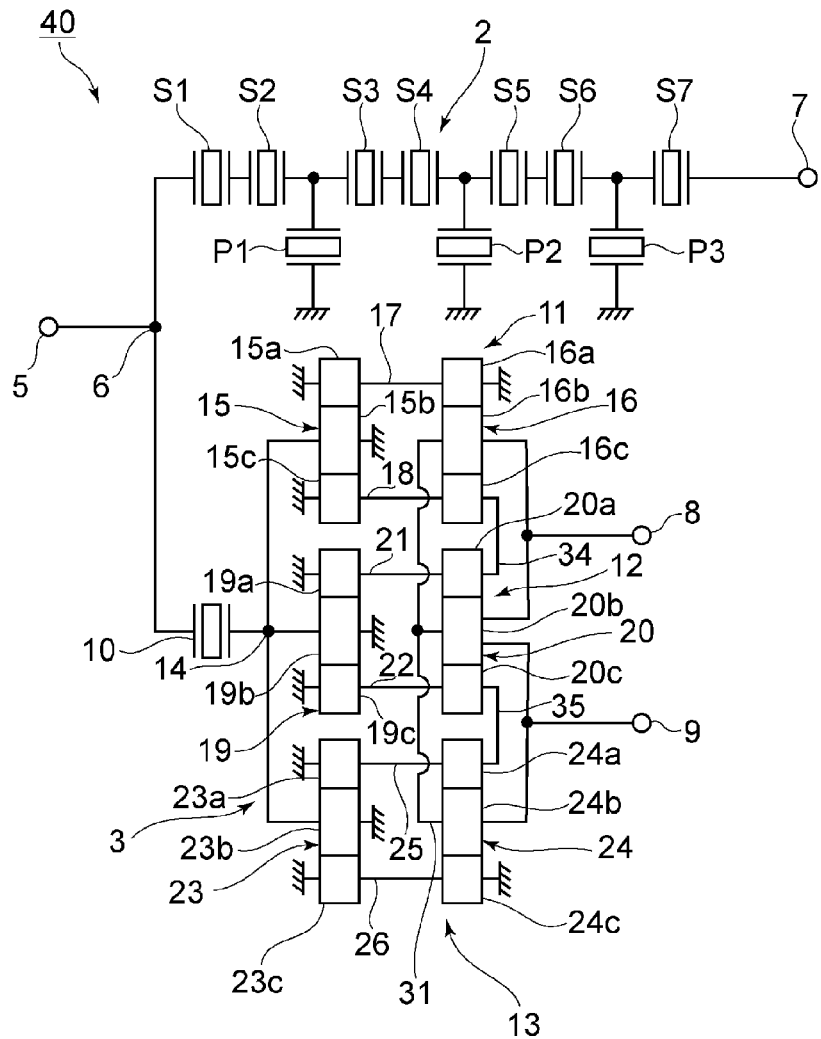
FIG. 4 is a circuit diagram of a signal separation apparatus according to a second preferred embodiment of the present invention.

FIG. 4 is a circuit diagram of a signal separation apparatus 40 according to a second preferred embodiment of the present invention. In the present preferred embodiment, the virtual ground wiring lines 32 and 33 in the first preferred embodiment are not provided, and the end portions of the IDT electrodes 15c, 19a, 19c, and 23a to be connected to the ground potential are connected to the ground potential rather than to the virtual ground wiring lines. In this manner, the virtual ground wiring lines 32 and 33 need not be provided on the input side of the reception filter 3. Since the IDT electrodes 15c, 19a, 19c, and 23a are connected to the ground potential, grounding is strengthened in this case.

Figure 5:
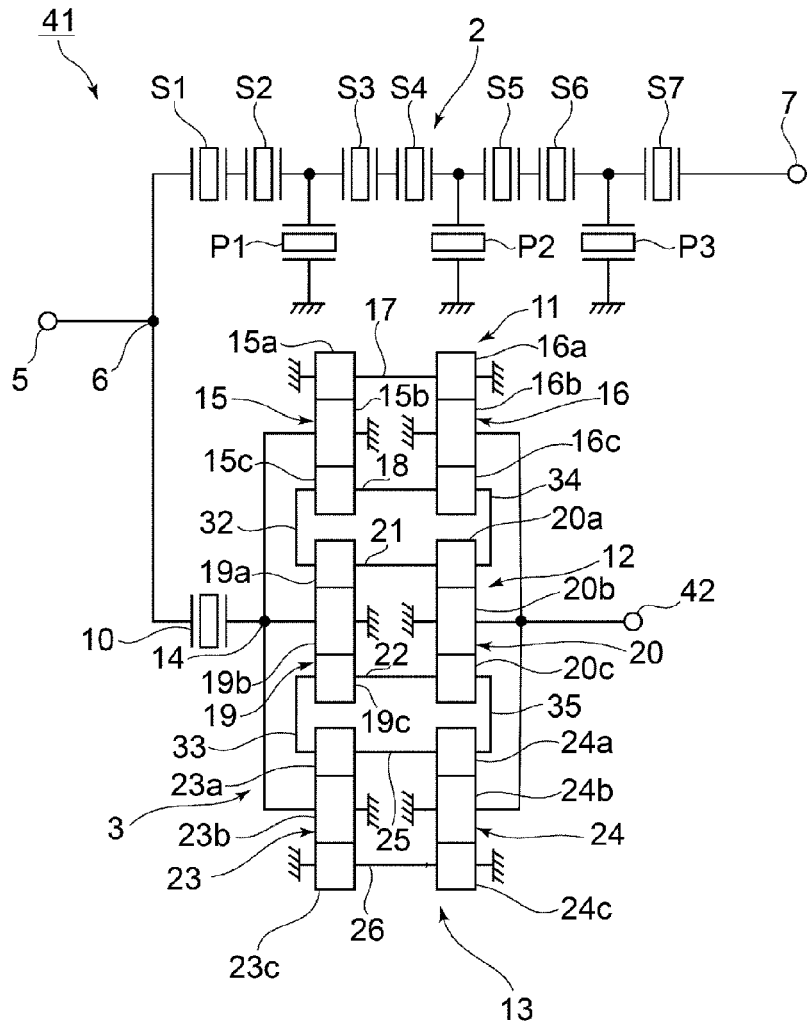
FIG. 5 is a circuit diagram of a signal separation apparatus according to a third preferred embodiment of the present invention.

Although the reception filters 3 in the first preferred embodiment and the second preferred embodiment preferably are balanced-type filters, the reception filter 3 may be an unbalanced-type filter as in a third preferred embodiment of the present invention illustrated in FIG. 5. In other words, in a signal separation apparatus 41 of the third preferred embodiment illustrated in FIG. 5, the IDT electrode 20b at the center of the second group-B longitudinally coupled resonator-type elastic wave filter device 20 in the second longitudinally coupled resonator-type elastic wave filter device 12 is not divided, and is connected, along with the IDT electrodes 16b and 24b, to a reception terminal 42 which is an unbalanced terminal.

As described above, the reception filter in the signal separation apparatus according to various preferred embodiments of the present invention may be an unbalanced-type filter, for example. Note that the elastic wave filter may be a boundary acoustic wave filter, and is not limited to a surface acoustic wave filter, in the present invention.

Further, in the preferred embodiments described above, although three-IDT longitudinally coupled resonator-type elastic wave filter units are preferably used, five-IDT longitudinally coupled resonator-type elastic wave filter units may be used.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A signal separation apparatus comprising:
   a piezoelectric substrate;
   a reception filter located on the piezoelectric substrate; and
   a transmission filter located on the piezoelectric substrate; wherein
   the reception filter includes an input terminal, an output terminal, and first, second and third longitudinally coupled resonator elastic wave filter devices electrically connected in series or in parallel with one another on at least one of an input terminal side and an output terminal side;
   the first, second and third longitudinally coupled resonator elastic wave filter devices are configured such that first, second and third group-A longitudinally coupled resonator elastic wave filter units are respectively cascade-connected with first, second and third group-B longitudinally coupled resonator elastic wave filter units in two stages, and the longitudinally coupled resonator elastic wave filter units each include an IDT electrode;
   a virtual ground wiring line that is not connected to a ground potential and that connects ground terminals of adjacent ones of the longitudinally coupled resonator elastic wave filter units to each other, on at least one of a first, second, and third group-A longitudinally coupled resonator elastic wave filter units side and a first, second, and third group-B longitudinally coupled resonator elastic wave filter units side, is further provided; and
   the transmission filter is located in a region extending from the reception filter in an interstage direction of the two-stage cascade connection in the reception filter.

2. The signal separation apparatus according to claim 1, wherein
   an output terminal of the reception filter includes a pair of balanced reception terminals;
   the reception filter is a balanced reception filter; and
   ground terminals of the IDT electrodes connected to the pair of balanced reception terminals are electrically connected to each other by the virtual ground wiring line.

3. The signal separation apparatus according to claim 2, wherein the virtual ground wiring line includes a first virtual ground wiring line that connects ground terminals of at least two of the first, second, and third group-A longitudinally coupled resonator elastic wave filter units to one another; and the virtual ground wiring line includes a second virtual ground wiring line that connects ground terminals of at least two of the first, second, and third group-B longitudinally coupled resonator elastic wave filter units to one another is provided.

4. The signal separation apparatus according to claim 1, further comprising a first interstage connection wiring line and a second interstage connection wiring line configured such that the first group-A longitudinally coupled resonator elastic wave filter unit and the first group-B longitudinally coupled resonator elastic wave filter unit are cascade-connected with each other in two stages through the first interstage connection wiring line and the second interstage connection wiring line, and a signal flowing through the first interstage connection wiring line and a signal flowing through the second interstage connection wiring line have opposite phases.

5. The signal separation apparatus according to claim 1, wherein the transmission filter is a ladder filter including a plurality of elastic wave resonators.

6. The signal separation apparatus according to claim 1, wherein the transmission filter includes a plurality of series arm resonators and parallel arm resonators.

7. The signal separation apparatus according to claim 6, wherein each of the plurality of series arm resonators and parallel arm resonators include a plurality of one-port elastic wave resonators.

8. The signal separation apparatus according to claim 1, wherein the reception filter includes a one-port elastic wave resonator.

9. The signal separation apparatus according to claim 1, wherein end portions of the IDT electrodes are connected to the virtual ground wiring line.

10. The signal separation apparatus according to claim 1, wherein end portions of the IDT electrodes are connected to a ground potential.

11. The signal separation apparatus according to claim 1, wherein the reception filter is a balanced filter.

12. The signal separation apparatus according to claim 1, wherein the reception filter is an unbalanced filter.

13. The signal separation apparatus according to claim 1, wherein each of the first, second and third longitudinally coupled resonator elastic wave filter devices is one of a surface acoustic wave filter and a boundary acoustic wave filter.

14. The signal separation apparatus according to claim 1, wherein each of the first, second and third group-A longitudinally coupled resonator elastic wave filter units and the first, second and third group-B longitudinally coupled resonator elastic wave filter units is one of a three-IDT longitudinally coupled resonator elastic wave filter unit and a five-IDT longitudinally coupled resonator elastic wave filter unit.

* * * * *